United States Patent [19]

Shiraishi

[11] Patent Number: 5,294,565
[45] Date of Patent: Mar. 15, 1994

[54] CRYSTAL GROWTH METHOD OF III - V COMPOUND SEMICONDUCTOR

[75] Inventor: Yasushi Shiraishi, Tokyo, Japan

[73] Assignee: NEC Corporation, Tokyo, Japan

[21] Appl. No.: 916,689

[22] Filed: Jul. 22, 1992

[30] Foreign Application Priority Data

Jul. 23, 1991 [JP] Japan .................................. 3-182636

[51] Int. Cl.$^5$ .......................................... H01L 21/20
[52] U.S. Cl. .................... 437/105; 437/107; 437/126; 437/133; 437/948; 156/613; 156/614; 148/DIG. 65; 148/DIG. 104; 148/DIG. 105; 148/DIG. 106
[58] Field of Search .............. 437/105, 107, 133, 126, 437/948; 148/DIG. 104, DIG. 105, DIG. 106, DIG. 65; 156/613, 614

[56] References Cited

U.S. PATENT DOCUMENTS 5,036,022 7/1991 Kuech et al. .

FOREIGN PATENT DOCUMENTS 349781 1/1990 European Pat. Off. .

OTHER PUBLICATIONS

Buchau et al "Epitaxial growth of GaAs with $(C_2H_5)_2GaCl$ and $AsH_3$ in a hot wall system" Jr. Crys. Growth 107 (1991), 331-336.
Selective epitaxy of GaAs, $Al_xGa_{1-x}As$, and $In_xGa_{1-x}As$, T. F. Keuch, et al., Journal of Crystal Growth, vol. 107, Nos. 1/4 Jan. 1, 1991, pp. 116-128, Amsterdam, NL.

Primary Examiner—Olik Chaudhuri
Assistant Examiner—Ramamohan Rao Paladugu
Attorney, Agent, or Firm—Burns, Doane, Swecker & Mathis

[57] ABSTRACT

An epitaxial growth method of a single crystal of III-V compound semiconductor on the surface of a semiconductor substrate by supplying a molecular beam of a group III source material and a molecular beam of a group V source material onto the surface of the substrate in a chamber held in vacuum. With this method, the molecular beams comprises a molecular beam of a first group III source material composed of an organic metal compound of a group III element not having a halogen, a molecular beam of a second group III source material having a halogen chemically bonded to atoms of the group III element, and a molecular beam of a group V source material making a compound semiconductor with the group III element of the first group III material. By setting a substrate temperature at, for example, about 500° C. a single crystal of III-V compound semiconductor can be satisfactorily selectively grown. As the first source material, an organic metal compound of a group III element having an alkyl, for example, trimethyl gallium (TMGa) or triethyl gallium (TEGa) is employed and as the second source material, for example, diethyl gallium chloride (DEGaCl), ethyl gallium di-chloride (EGaDCl) or trichlorogallium ($GaCl_a$), which has a chlorine, or diethyl gallium bromide (DEGaBr) having a bromine is employed. As the group V source material, for example, As, P or Sb is employed.

23 Claims, 2 Drawing Sheets

CRYSTAL GROWTH METHOD OF III - V COMPOUND SEMICONDUCTOR

BACKGROUND OF THE INVENTION

1. Field of the Invention

This invention relates to a method of epitaxially growing a single or mixed crystal of III-V compound semiconductor such as gallium arsenide (GaAs) and the like on a semiconductor substrate.

2. Description of the Prior Art

Previously, a metalorganic molecular beam epitaxy (MOMBE) has been known as an example of crystal growth methods of a III-V compound semiconductor such as gallium arsenide (GaAs) and the like. In the MOMBE method, group III and V materials each as a molecular beam are supplied on the surface of a semiconductor substrate in a growth chamber held at an ultra-high level of vacuum as in the case of a general molecular beam epitaxy (MBE), but different therefrom in that the MOMBE method uses an organic metal compound as the group III material. Compared with the MBE method, the MOMBE method is advantageous in that such a crystal layer that has reduced surface defect can be obtained at a superior selective growthability. Compared with a metalorganic vapor phase epitaxy (MOVPE), the MOMBE method is also advantageous in that the composition and thickness of a layer to be formed can be highly controlled as well as the uniformity thereof can be made superior, which means that the method offers an extremely effective technique as the crystal growth method of compound semiconductor.

The MOMBE method has been used for producing various semiconductor devices. For example, in the case of growing a single crystal of gallium arsenide (GaAs) semiconductor, alkyl compounds such as trimethyl gallium (TMGa), triethyl gallium (TEGa) and the like, each having an alkyl chemically bonded to the gallium atoms, are used as a gallium source material. In the case of growing a single crystal of aluminum arsenide (AlAs), alkyl compounds such as trimethyl aluminum (TMAl), triethyl aluminum (TEAl) and the like, each having an alkyl chemically bonded to the aluminum atoms, are used as an aluminum source material. In any case, as an arsenic source material, metallic arsenic (As4) or arsenic hydrides such as arsine ($AsH_a$) and the like are used. In making a heterojunction bipolar transistor (HBT), as the group III source material, for example, TEGa, TMGa or TEAl is used and as the group V source material, for example, $AsH_a$ is used.

On the other hand, as the group III source material, such an organic metal compound that has a methyl chemically bonded to the metal atoms as TMGa is used, the carbon contained in the methyl is taken during crystal growth into an epitaxially grown layer, thus being inclined that the epitaxially grown layer is susceptible to exhibit a p-type electroconductivity. For this, investigation results were reported, for example, by N. Furuhata and other researchers in "Journal of Crystal Growth", Vol.102, p.814, 1990, in which TEGa having an ethyl is used as the group III source material and $As_4$ was used as the group V source material, and a single crystal of GaAs was epitaxially grown. This report reveals that under such growth conditions that a temperature of the substrate is 500° C., flow rate of TEGa is 0.8 cc/min and pressure of $As_4$ is $1.5 \times 10^{-4}$ Torr, such a high purity GaAs single crystal can be obtained that has a p-type electroconductivity, a carrier concentration of $1.5 \times 10^{14}$ cm$^{-3}$ and a carrier mobility at room temperature of 400 cm$^2$/V.s.

A single crystal of III-V compound semiconductor with a low dopant concentration or with a high purity, as the group III source material, an organic metal compound having an alkyl (for example, ethyl) which is easy to be desorbed from the group III element atoms compared with the methyl is generally used in general. When such an organic metal compound that has an alkyl as shown above is used, if an n-type impurity such as silicon (Si) and the like is doped during growth, an n-type single crystal can be obtained which is low in compensation ratio.

With the conventional MOMBE method, in case that an organic metal compound such as TEGa as the group III source material is used to grow a single crystal of high purity (low impurity concentration) or n-type GaAs semiconductor, there arises such a problem that a good selective growthability of the single crystal cannot be obtained unless the growth temperature, that is, temperature of the substrate exceeds 600° C. Namely, when organic metal compound molecules as TEGa and As molecules are supplied from the upper side of a mask (for example, made of a silicon dioxide) formed on the surface of a GaAs substrate thereby to epitaxially grow a single crystal of GaAs semiconductor only on the unmasked area of the surface of the substrate, if only one kind of organic metal compound is supplied as the group III source material as in the conventional MOMBE method, the single crystal of GaAs semiconductor can be grown on the unmasked surface of the substrate at a temperature not exceeding 600° C., however, polycrystalline GaAs semiconductor is deposited simultaneously on the mask, thus being unobtainable a satisfactory selective growthability. Such a phenomenon is outstanding when an organic metal compound having an ethyl as TEGa is used as the group III source material.

Detailed and concrete explanations will be made below. When a high purity GaAs single crystal is grown using TEGa only as the group III source material using the MOMBE method, the temperature of a substrate is preferably to be set at about 500° C. This is based on the fact that if it exceeds 500° C., a p-type GaAs crystal with a high impurity concentration is grown thereby being unobtainable a high purity GaAs crystal. In addition, even when an n-type GaAs crystal having a low compensation ratio is to be grown by this method, it is preferable to set the temperature of the substrate at about 500° C. This is based on the fact that at a higher temperature than 500° C., a high purity GaAs crystal cannot be grown on the substrate as already shown above. As a result, even if the single crystal of GaAs is grown while doping an n-type impurity at a high concentration, only the single crystal of n-type GaAs semiconductor extremely high in compensation ratio is grown.

Then, if using TEGa only as the group III source material, a high purity GaAs single crystal or low compensation ratio n-type GaAs single crystal is grown on the surface of a GaAs substrate with a mask formed thereon using the MOMBE method at a substrate temperature of about 500° C., it can be grown on the unmasked area of the surface of the substrate and at same time, polycrystalline GaAs is deposited on the masked area thereof. This is schematically illustrated in FIG. 1.

In FIG. 1, on the surface of a GaAs substrate 1 is formed a mask 2 made of a silicon dioxide ($SiO_2$) film. On the exposed surface of the GaAs substrate 1 where the mask 2 is not provided to form an opening, a single-crystalline GaAs layer 3 is grown and a thick polycrystalline GaAs layer 4 is grown on the mask 2.

As explained above, with the conventional MOMBE method, if the temperature of a substrate is set at a low level of about 500° C., it is impossible to selectively grow a high purity GaAs single crystal or n-type GaAs single crystal having a low compensation ratio on the substrate and as a result, with the conventional MOMBE method, devices such as, for example, a heterojunction field effect transistor having a low source resistance cannot be produced by selectively growing an n-type single-crystalline GaAs layer having a high impurity concentration only at an ohmic electrode portion.

Thus, an object of this invention is to provide a crystal growth method of a III-V compound semiconductor in which a single crystal of III-V compound semiconductor can be satisfactorily selectively grown on a substrate by setting a temperature of the substrate at a lower level (for example, at about 500° C.) than would be set conventionally.

SUMMARY OF THE INVENTION

In a first aspect of this invention, a crystal growth method of a III-V compound semiconductor is provided in which molecular beams of group III source materials and a molecular beam of a group V source material are supplied onto the surface of a substrate in a chamber held in vacuum thereby to epitaxially grow a single crystal of III-V compound semiconductor on the surface thereof. The molecular beams comprises a molecular beam of a first group III source material composed of an organic metal compound of a group III element not having a halogen, a molecular beam of a second group III source material having a halogen chemically bonded to the atoms of the group III element thereof and a molecular beam of a group V source material making a compound semiconductor with the group III element of the first source material.

As the first group III source material composed of an organic metal compound, a compound which does not include a halogen is employed. This is due to the fact that if it includes a halogen, a single-crystalline III-V compound semiconductor cannot be grown or can be grown at an extremely low growth rate even it is made possible.

As the first source material, an organic metal compound of a group III element may be used if it does not have a halogen. For example, such an organic metal compound of a group III element that does have an alkyl but does not have a halogen as would be conventionally employed in the MOMBE or MOVPE method may be used for this purpose. Concretely explained, when the group III element is Ga, trimethyl gallium (TMGa) or triethyl gallium (TEGa) is preferably employed. When it is Al, trimethyl aluminum (TMAl) or triethyl aluminum (TEAl) is preferably employed, and when it is In, trimethyl indium (TMIn) or triethyl indium (TEIn) is preferably employed.

As the second group III source material, such a material that has a halogen chemically bonded to atoms of a group III element, for example, of Ga, In or Al is employed. The second source material may not be an organic metal compound, however, it is preferable to be an organic metal compound in order to exert advantages of the MOMBE method. As the second source material composed of an organic metal compound, when the group III element is Ga, diethyl gallium chloride (DEGaCl), ethyl gallium dichloride (EGaDCl) or trichlorogallium (GaCl3), which has a chlorine, is preferably employed. In this case, however, diethyl gallium bromide (DEGaBr) having a bromine, or materials having a fluorine or iodine may be used for this purpose. In addition, when it is In or Al, the same material as that obtained by substituting the Ga in the compound with In or Al may be employed.

The material having a halogen chemically bonded to the atoms of the group III element of the second source material makes inactive the surface of a mask formed on the surface of the semiconductor substrate thereby to prevent the mask surface from being deposited with a III-V compound obtained by chemically bonding the atoms of the group III element contained in the organic metal compound of the first source material to the atoms of the group V element. As a result, any other material than those shown above may be used for this purpose, if allowed to act as above.

The action that makes it inactive, which differs depending on the material to be used, is easily effected at about 500° C. or below, for example, when DEGaCl is used. As a result, it makes possible to selectively grow a crystal of III-V compound semiconductor even at a lower temperature (for example, 400° C.) as compared with the case of not using the second source material.

The material having a halogen chemically bonded to atoms of a group III element is easily desorbed from the substrate, thus giving no influence on the crystal growth of a III-V compound semiconductor on the substrate surface. As a result, by applying the second source material, there is no doubt that the growth rate thereof cannot be reduced compared with the case of not applying the second source material.

The group III elements of the first and second source materials are generally the same, however, they may be different from each other.

The group V source material is selected from group V elements making a compound semiconductor with the group III element of the first source material. For example, when the group III element is Ga, the group V element to be selected is As, P or Sb. In this case, however, this invention is not limited thereto, any generally used group V element may be employed for this purpose. A case in point is that when it is As, metal arsenic ($As_4$) or arsine ($AsH_3$) is preferably employed.

In case of growing a III-V compound semiconductor as a mixed crystal, plural kinds of the group III and/or V materials are supplied simultaneously according to the composition of the mixed crystal. In this case, one or plural kinds of the second group III source material are also supplied simultaneously.

In using the method of this invention, any apparatus used for a conventional MOMBE method may be employed, if it makes possible to supply the first and second group III source materials and the group V source material simultaneously with each other.

The supplying rates per unit time of the first and second source materials are preferable equal to each other, but may be different from each other. When different from each other, it is preferable that the supplying rate of the second source material is larger than that of the first source material. More preferably, the supplying rate of the second source material is about one to two times that of the first one. This is because if the supplying rate of the second source material is in excess, the pressure in the growth chamber may be disadvantageously increased.

The growth conditions may be set as generally made in the conventional MOMBE method excepting that the second source material is to be supplied simultaneously, however, it is preferable to be set as follows:

supplying rate per unit time of first source material; 0.5 to 2.0 cc/min.

supplying rate per unit time of second source material; 0.5 to 2.0 cc/min, pressure of group V element gas; $5 \times 10^{-5}$ to $2 \times 10^{-4}$ Torr.

substrate temperature; 450° to 500° C.

In a second aspect of this invention, a selective growth method of III-V compound semiconductor crystal is provided. This method comprises a step of forming a patterned mask on the surface of a semiconductor substrate, and a step of supplying a molecular beam of a first group III source material composed of an organic metal compound of a group III element not having a halogen, a molecular beam of a second group III source material having a halogen chemically bonded to the atoms of the group III element and a molecular beam of a group V source material making a compound semiconductor with the group III element of the first source material on the surface of the substrate from the upper side of the mask in a chamber held in vacuum.

With this method, molecules of the materials supplied into the chamber are epitaxially grown as a single crystal of a compound semiconductor composed of the group III and V elements on an unmasked area of the surface of the substrate. The surface of the mask, as shown in the first aspect, is made inactive by the second source material having a halogen chemically bonded to the atoms of the group III element, so that the atoms of the group III element contained in the organic metal compound of the first material is prevented from being chemically bonded to the atoms of the group V element, resulting in no deposition of III-V compound on the surface of the mask. This means that the selective growth of a single crystal of III-V compound semiconductor is allowed to be made on only the unmasked area of the surface of the substrate.

The material composed of an organic metal compound of a group III element not having a halogen, the material having a halogen chemically bonded to the atoms of the group III element, and the group V material to be employed in this aspect may be equal to those of the first aspect. The apparatus and growth conditions are equal to those of the first aspect.

The mask to be used in the second aspect may be formed of a silicon dioxide as generally used, however, it may be formed of any other material, for example, of a silicon nitride.

DESCRIPTION OF THE PREFERRED EMBODIMENTS

One preferred embodiment of this invention will be described below by referring to FIGS. 2 and 3.

Figure 2:
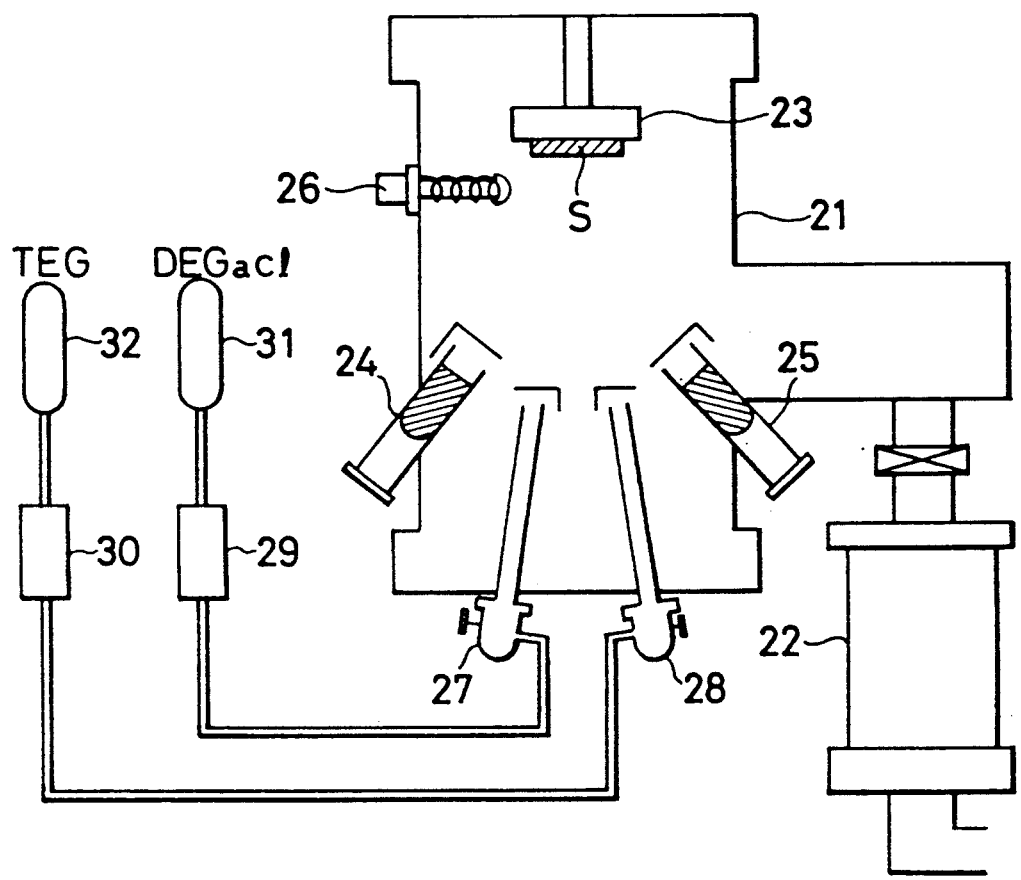
FIG. 2 is a schematic view which illustrates an arrangement of an apparatus to be used for an MOMBE method of this invention.

FIG. 2 shows an apparatus to be used for realizing the method of this invention. This apparatus has a growth chamber 21 containing a heating unit 23 for heating a semiconductor substrate S being supported by a holder up to a predetermined temperature, a nude ion gauge for measuring a pressure of the growth chamber 21 and beam intensities, a cell 24 for supplying a group V source material, a cell 25 for supplying an n-type dopant, a cell 27 for supplying a second source material gas having a halogen chemically bonded to atoms of a group III element, and a cell 28 for supplying a first source material gas composed of an organic metal compound of a group III element not having a halogen. The first and second source material gasses from a first source material tank 32 and a second source material tank 31 are passed through the supplying lines to the cells 28 and 27, respectively. The flow rates of supplying them are controlled by mass flow controllers 29 and 30 disposed onto the supplying lines, respectively. The atmosphere inside the growth chamber 21 is set at a predetermined degree of vacuum by an exhaust unit 22 connected thereto.

Next, one preferred embodiment of this invention using the apparatus as shown above will be explained below. In this embodiment, an n-type single-crystalline GaAs layer having a high impurity concentration is to be grown on an n-type GaAs substrate, in which TEGa is used as the first group III source material. DEGaCl is used as the second group III source material, metallic arsenic ($As_4$) is used as the group V source material and silicon (Si) is used as an n-type dopant.

Figure 1:
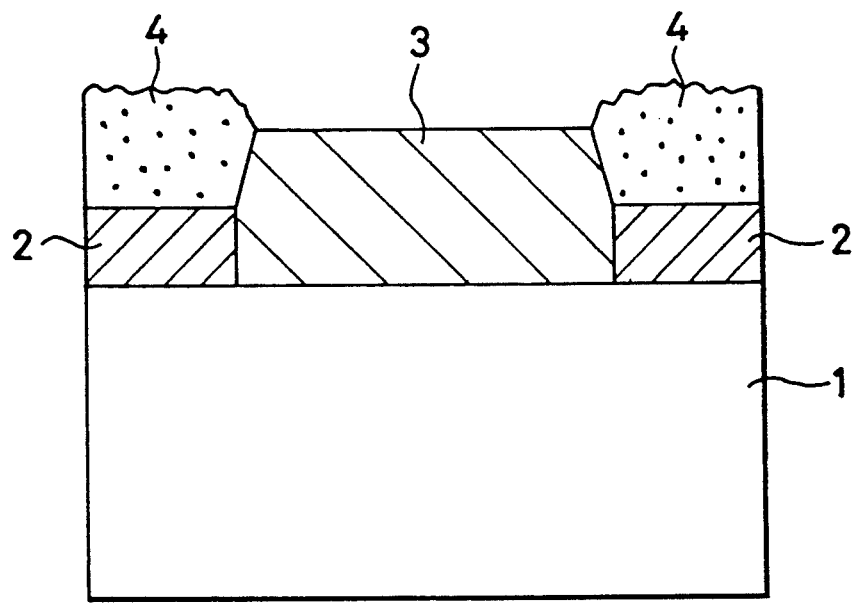
FIG. 1 is a partial sectional view which schematically illustrates a crystalline GaAs growth on a GaAs substrate with a mask formed thereon by a conventional MOMBE method.
Figure 3:
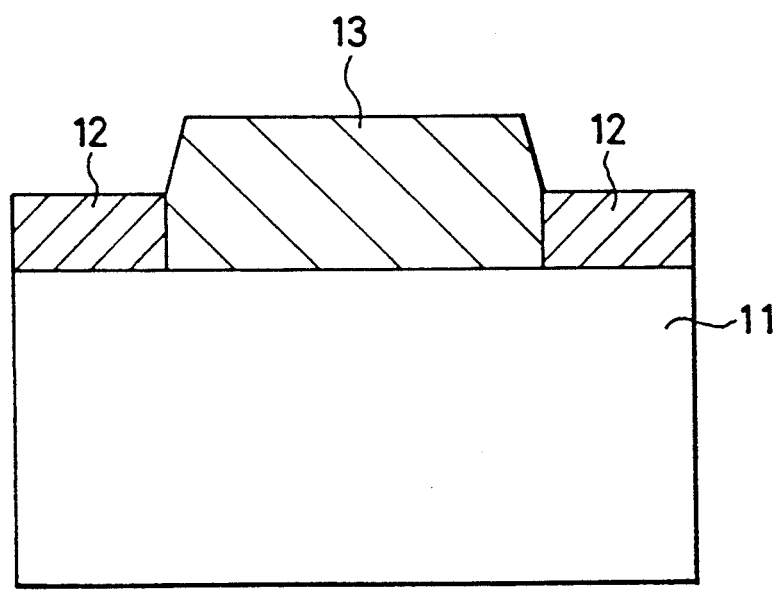
FIG. 3 is a partial sectional view which schematically illustrates a selective growth of crystalline GaAs on a GaAs substrate with a mask formed thereon by an MOMBE method of this invention.

First, as shown in FIG. 3, on the surface of an n-type GaAs substrate 11 is formed a mask 12 of silicon dioxide ($SiO_2$) patterned in a predetermined shape. The mask 12 may be formed, for example, in such a manner that a $SiO_2$ film is grown on the surface of the substrate 11 by a chemical vapor deposition (CVD) method, then, patterned a resist on the $SiO_2$ film by a photolithography method and thereafter, etched the resist using a solution of hydrofluoric acid to partially remove the $SiO_2$ film. The mask 12 may be patterned by any other method than that.

Subsequently, the substrate S thus formed the mask 12 thereon is mounted onto the substrate holder and then, the atmosphere inside the growth chamber 21 is set at a predetermined degree of vacuum. Then, under the specified growth conditions, the group V source material $As_4$, n-type dopant Si, second source material gas DEGaCl having a halogen chemically bonded to atoms of a group III element, first source material gas TEGa composed of an organic metal compound of a group III element not having a halogen are supplied as a molecular beam onto the surface of the substrate S from the cells 24, 25, 27 and 28, respectively. As a result, if the growth conditions are set appropriately, an n-type single-crystalline GaAs layer having a high impurity concentration can be selectively grown on the surface of the substrate S only.

The state that the layer is grown thereon is shown in FIG. 3, in which the n-type single-crystalline GaAs layer 13 is epitaxially grown only in an opening as an unmasked area formed in the SiO₂ mask 12, and polycrystalline GaAs layer does not exist on the mask 12.

In this embodiment, the reason why the n-type single-crystalline GaAs is allowed to be selectively grown satisfactorily is as follows;

In this embodiment, the first source material gas TEGa composed of an organic metal compound of a group III element is supplied simultaneously with the second source material gas DEGaCl onto the surface of the GaAs substrate S. The second source material gas DEGaCl having a chlorine is thermally decomposed on and/or near the surface of the substrate S and/or SiO₂ mask 12 to generate a compound, gallium chloride (GaCl). On the other hand, the first source material gas TEGa is thermally decomposed on and/or near the surface of the substrate and/or SiO₂ mask 12 into monoethyl gallium (MEGa) and/or diethyl gallium (DEGa).

The GaCl molecules generated through the thermal decomposition of DEGaCl act to make the surface of the SiO₂ mask 12 inactive. As a result, the MEGa and/or DEGa molecules generated through the thermal decomposition of TEGa is made difficult to be absorbed into the surface of the mask 12, that is, it becomes easy to be desorbed from the surface of the mask 12. Consequently, a large part of the MEGa and/or DEGa molecules are desorbed from the surface of the mask 12 before being chemically bonded to the As atoms, so that a polycrystalline GaAs layer is not deposited on the surface of the mask 12.

On the surface of the substrate S where the SiO₂ film is removed by etching, the Ga atoms of the MEGa and/or DEGa molecules are chemically bonded to the As atoms, so that a single-crystalline GaAs layer can be epitaxially grown thereon.

Almost all of the GaCl molecules are desorbed from the surface of the substrate S, so that there gives no influence to the growth of single-crystalline GaAs layer on the surface of the substrate S. As a result, the growth of single-crystalline GaAs layer can be performed at the same growth rate as that in the conventional growth method.

The DEGaCl and TEGa are easily thermally decomposed at a growth temperature of as low as 500° C. or below. This means that the selective growth of an n-type single-crystalline GaAs layer with a high impurity concentration can be achieved at a lower temperature (for example, as low as 400° C. or below) than would be used conventionally.

Such a selectively grown n-type GaAs layer with a high impurity concentration can be employed, for example, as an ohmic electrode of a heterojunction field effect transistor by forming thereon a layer of a gold (Au)—germanium (Ge)—nickel (Ni) alloy, thus being obtainable a highly performable transistor with a low source resistance.

In this embodiment, if grown without doping Si, a high purity single-crystalline GaAs layer can be selectively grown. In addition, if TMGa is used instead of TEGa as the first group III source material, a p-type single-crystalline GaAs layer can be selectively grown and in this case, a better selective growthability can be obtained than that conventionally attained at a lower level of growth temperature because of the inactive action of the second group III source material.

An experiment of growing an n-type single-crystalline GaAs layer with a high impurity concentration was carried out on a practical basis as explained above under the following growth conditions as:

flow rate of TEGa; 1 cc/min,
flow rate of DEGaCl; 1 cc/min,
pressure of As₄; $1 \times 10^{-4}$ Torr,
temperature of substrate; 500° C.

Then, the supplying line of TEGa was heated to about 70° C. and the supplying line of DEGaCl was heated to about 100° C. in order to stabilize the flow of them. The cell 25 for supplying n-type dopant Si was heated to 1050° C. Thus, the single-crystalline GaAs layer could be grown at a rate of about 1 μm/hr, resulting in obtaining it at an n-type impurity concentration of $3 \times 10^{13}$ cm$^{-3}$.

In this embodiment, as the first group III source material, TEGa is used and as the second group III source material, DEGaCl is used, but not limited thereto, ethyl gallium dichloride (EGaDCl) or trichlorogallium (GaCl₃) may be used instead of DEGaCl. In addition, if diethyl gallium bromide (DEGaBr) having a bromine is employed, the same effects can be obtained.

In this embodiment, besides, silicon dioxide (SiO₂) is used as the mask material, however, if other materials including silicon nitride (Si₃N₄) are used, the same effects can be obtained.

Further in addition, in this embodiment, explanations are made on the crystal growth of GaAs, but the same effects can be obtained when other III-V compound semiconductors are grown. For example, it may be applied for the crystal growth of indium arsenide (InAs) using triethyl indium (TEIn) and diethyl indium chloride (DEInCl).

What is claimed is:

1. An epitaxial growth method of a III-V compound semiconductor in which a molecular beam of a group III source material and a molecular beam of a group V source material are supplied onto a surface of a semiconductor substrate having a mask thereon in a chamber held in vacuum thereby to epitaxially grow a single-crystalline III-V compound semiconductor selectively on said surface of said substrate exposed from said mask, said molecular beams comprising:

a molecular beam of a first group III source material composed of an organic metal compound of a group III element not having a halogen;

a molecular beam of a second group III source material having a halogen chemically bonded to the atoms of said group III element; and a molecular beam of a group V source material making a compound semiconductor with the group III element of said first source material;

wherein said first group III source material is mainly used for growing said III-V compound semiconductor, and said second group III source material suppresses growth of said III-V compound semiconductor on a surface of said mask.

2. The method as claimed in claim 1, wherein said first group III source material is an organic metal compound of a group III element having an alkyl.

3. The method as claimed in claim 2, wherein said alkyl is one of methyl and ethyl.

4. The method as claimed in claim 1, wherein said first group III source material is one selected from the group consisting of trimethylgallium, triethylgallium, trimethylaluminum, triethylaluminum, trimethylindium and triethylindium.

5. The method as claimed in claim 1, wherein said second group III source material is an organic metal compound of a group III element having at least one of chlorine, bromine, fluorine and iodine.

6. The method as claimed in claim 1, wherein said second group III source material is one selected from the group consisting of diethylgalliumchloride, ethylgalliumdichloride, trichlorogallium and diethylgalliumbromide.

7. The method as claimed in claim 1, wherein said group III element is gallium and said group V element is one of arsenic, phosphorous and antimony.

8. The method as claimed in claim 7, wherein said first group III source material is triethylgallium and said second group III source material is diethylgalliumchloride.

9. A selective growth method of a III-V compound semiconductor crystal comprising the steps of:
    forming a patterned mask on a surface of a semiconductor substrate;
    placing said substrate with said mask in a chamber held in vacuum; and
    supplying a molecular beam of a first group III source material composed of an organic metal compound of a group III element not having a halogen, a molecular beam of a second group III source material having a halogen chemically bonded to the atoms of said group III element and a molecular beam of a group V source material making a compound semiconductor with a group III element of said first source material onto a surface of said substrate from an upper side of said mask in said chamber;
    wherein said first group III source material is mainly used for growing said III-V compound semiconductor, and said second group III source material suppresses growth of said III-V compound semiconductor on a surface of said mask.

10. The method as claimed in claim 9, wherein said mask is made of one of silicon dioxide and silicon nitride.

11. The method as claimed in claim 9, wherein said first group III source material is an organic metal compound of a group III element having an alkyl.

12. The method as claimed in claim 11, wherein said alkyl is one of methyl and ethyl.

13. The method as claimed in claim 9, wherein said first group III source material is one selected from the group consisting of trimethylgallium, triethylgallium, trimethylaluminum, triethylaluminum, trimethylindium and triethylindium.

14. The method as claimed in claim 9, wherein said second group III source material is an organic metal compound of a group III element having at least one of chlorine, bromine, fluorine and iodine.

15. The method as claimed in claim 14, wherein said second group III source material is one selected from the group consisting of diethylgalliumchloride, ethylgalliumchloride, trichlorogallium and diethylgalliumbromide.

16. The method as claimed in claim 9, wherein said group III element is gallium and said group V element is one of arsenic, phosphorous and antimony.

17. The method as claimed in claim 16, wherein said first group III source material is triethylgallium and said second group III source material is diethylgalliumchloride.

18. The method as claimed in claim 1, wherein a temperature of said substrate is about 500° C. or lower.

19. The method as claimed in claim 1, wherein a supplying rate of said second group III source material ranges from about 1 to 2 times that of said first group III source material.

20. The method as claimed in claim 1, wherein supplying rates of said first and second group III source materials into said chamber are 0.5 to 2 cc/min.

21. The method as claimed in claim 9, wherein a temperature of said substrate is about 500° C. or lower.

22. The method as claimed in claim 9, wherein a supplying rate of said second group III source material ranges from about 1 to 2 times that of said first group III source material.

23. The method as claimed in claim 9, wherein supplying rates of said first and second group III source materials into said chamber are 0.5 to 2 cc/min.

* * * * *